United States Patent
Cahalane

(10) Patent No.: US 8,441,319 B2
(45) Date of Patent: May 14, 2013

(54) METHOD AND APPARATUS FOR BIASING RAIL TO RAIL DMOS AMPLIFIER OUTPUT STAGE

(75) Inventor: Aidan Cahalane, Co. Clare (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/236,950

(22) Filed: Sep. 20, 2011

(65) Prior Publication Data

US 2012/0319777 A1   Dec. 20, 2012

Related U.S. Application Data

(60) Provisional application No. 61/498,330, filed on Jun. 17, 2011.

(51) Int. Cl.
*H03F 3/26* (2006.01)
(52) U.S. Cl.
USPC .......................................... 330/264; 330/267

(58) Field of Classification Search .................. 330/264, 330/267, 269
See application file for complete search history.

(56) References Cited

U.S. PATENT DOCUMENTS

| | | | | |
|---|---|---|---|---|
| 4,057,764 A * | 11/1977 | Yokoyama | ..................... | 330/264 |
| 7,368,992 B2 * | 5/2008 | Sandquist | ..................... | 330/264 |
| 2009/0153248 A1 * | 6/2009 | Sun et al. | ....................... | 330/264 |

* cited by examiner

*Primary Examiner* — Steven J Mottola
(74) *Attorney, Agent, or Firm* — Kenyon & Kenyon LLP

(57) ABSTRACT

An amplifier comprises: an input stage for receiving incoming signals; a high gain stage coupled to the input stage and providing driving signals in response to the incoming signals to an output driver stage; and an output terminal coupled to the output driver stage. The output driver stage comprises a high side driver circuit having a first terminal receiving a first driving signal pdrive from the high gain stage, a second terminal coupled VDD through a first voltage drop, and a third terminal coupled to the output terminal of the amplifier.

20 Claims, 11 Drawing Sheets

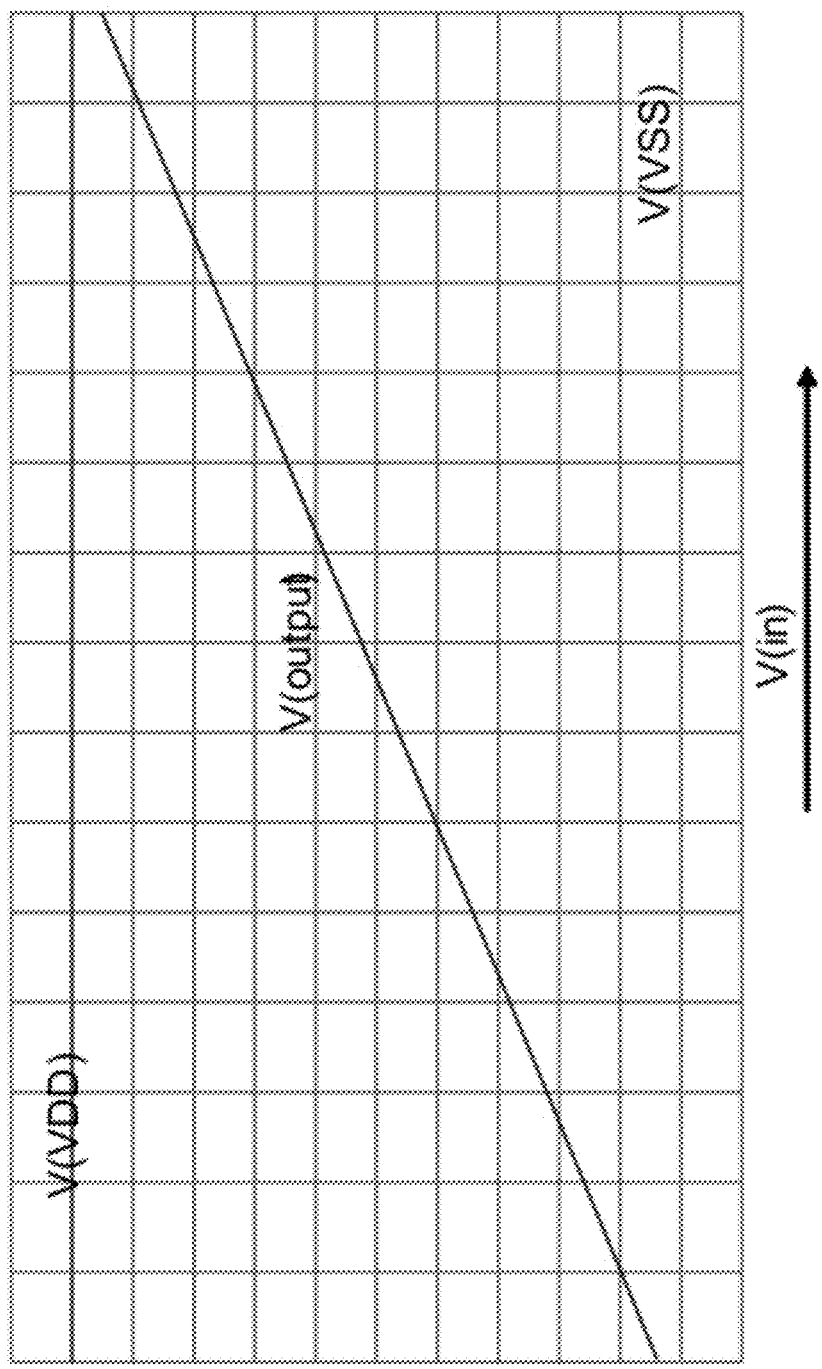

METHOD AND APPARATUS FOR BIASING RAIL TO RAIL DMOS AMPLIFIER OUTPUT STAGE

RELATED APPLICATION

This application claims priority under 35 U.S.C.§119 to U.S. Provisional Patent Application No. 61/498,330, filed on Jun. 17, 2011, which is herein incorporated by reference in its entirety.

BACKGROUND INFORMATION

Portable electrical equipment increasingly uses a single supply voltage of 5V or less, and reduced supply voltage designs need to use the complete power supply span, or rail to rail power supply, to have a usable dynamic range. FIG. 1A shows the diagram of a prior art rail to rail output DMOS amplifier. As shown, the amplifier 100 is a multi stage amplifier, with a high gain stage followed by an output driver stage. An input stage 101 receives input signals inputp and inputn and provides output signals a1 and ndrive. A high gain stage comprises a high side current mirror 102, an output biasing circuit 103 and a low side current source 104. The output driver stage comprises a high side PMOS driver 105 and a low side NMOS driver 106. The output biasing circuit 103 receives input currents from the low side current source 104 and the high side current mirror 102. In response to the input currents, the output bias block 103 sets the bias voltage pdrive for the high side driver 105 and ndrive the low side driver 106.

The high side current mirror 102 comprises high side current mirrors 1021 and 1022 which receive b1 and pdrive from the output biasing circuit 103 respectively, and are coupled to the power rail VDD. The low side current source 104 comprises low side current sources 1041 and 1042 which receive a1 and ndrive from the input stage 101 respectively, and are coupled to the power rail VSS. The high side PMOS driver 105's gate is controlled by pdrive, and its source is coupled to VDD. The low side NMOS driver 106's gate is controlled by ndrive, and its source is coupled to VSS. The output 107 of the amplifier is taken from the conjunction of the drains of drivers 105 and 106. The output swing is VDD to VSS, as shown in FIG. 1B. In other words, it's output is rail to rail.

The connection between the output driver stage and the preceding stage (e.g., the high gain stage in FIG. 1A) effects the performance of the preceding stage and hence the amplifier gain. In a typical MOS amplifier, the last gain stage (e.g., the high gain stage in FIG. 1A) will drive the gate of a MOS output driver, which may be a high side PMOS or a low side NMOS for amplifiers that can drive to one or both rails (e.g., the output driver stage in FIG. 1A). In the amplifier shown in FIG. 1A, the gate bias voltage of a driver is a gate to source voltage Vgs away from the power rails, and the headroom across the high gain stage current mirrors/sources is VDD−Vpdrive=Vgs_p on the high side, and Vndrive−VSS=Vgs_n on the low side. Thus, over process skew and temperatures on many amplifiers, the preceding stage current mirrors must stay in saturation with a headroom of just one Vgs, e.g., Vgs_p or Vgs_n in FIG. 1A.

The headroom, or the Vgs, can be as low as 0.4V at high operating temperatures and process skew. This limits the amount of degeneration overdrive and cascoding that can be used in implementing the biasing of the mirrors. This can directly effect their matching (amplifier offset) and also their output impedance (amplifier gain). The lower the gate to source voltage Vgs of the output driver, the more difficult it is to keep the gain of the preceding gain stage high. This is usually because the preceding stage has a high output impedance current mirror/source. As the voltage headroom across this drops, the current mirror/source can come out of saturation, resulting in a drop in the impedance at the output of the gain stage which lowers the amplifier gain. This is particularly the case for a two stage amplifier with one high gain stage followed by a drive stage.

Therefore, it would be desirable to provide a method and circuit to increase the drive voltage in the output driver. This will allow more headroom across the mirrors and allow better biasing and performance of the mirrors, enhancing the amplifier performance and robustness in a simple manner.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

FIG. 1B shows the signal waveform of the amplifier in FIG. 1A.

DETAILED DESCRIPTION OF EXAMPLE EMBODIMENTS

The present invention provides a method and circuit for biasing the output stage of an amplifier to provide more headroom for current mirrors/sources of the preceding stage. This allows the current mirrors/sources to be biased further into saturation, increasing the gain and avoiding the possibility of the mirrors coming out of saturation and collapsing the gain.

Figure 1A:
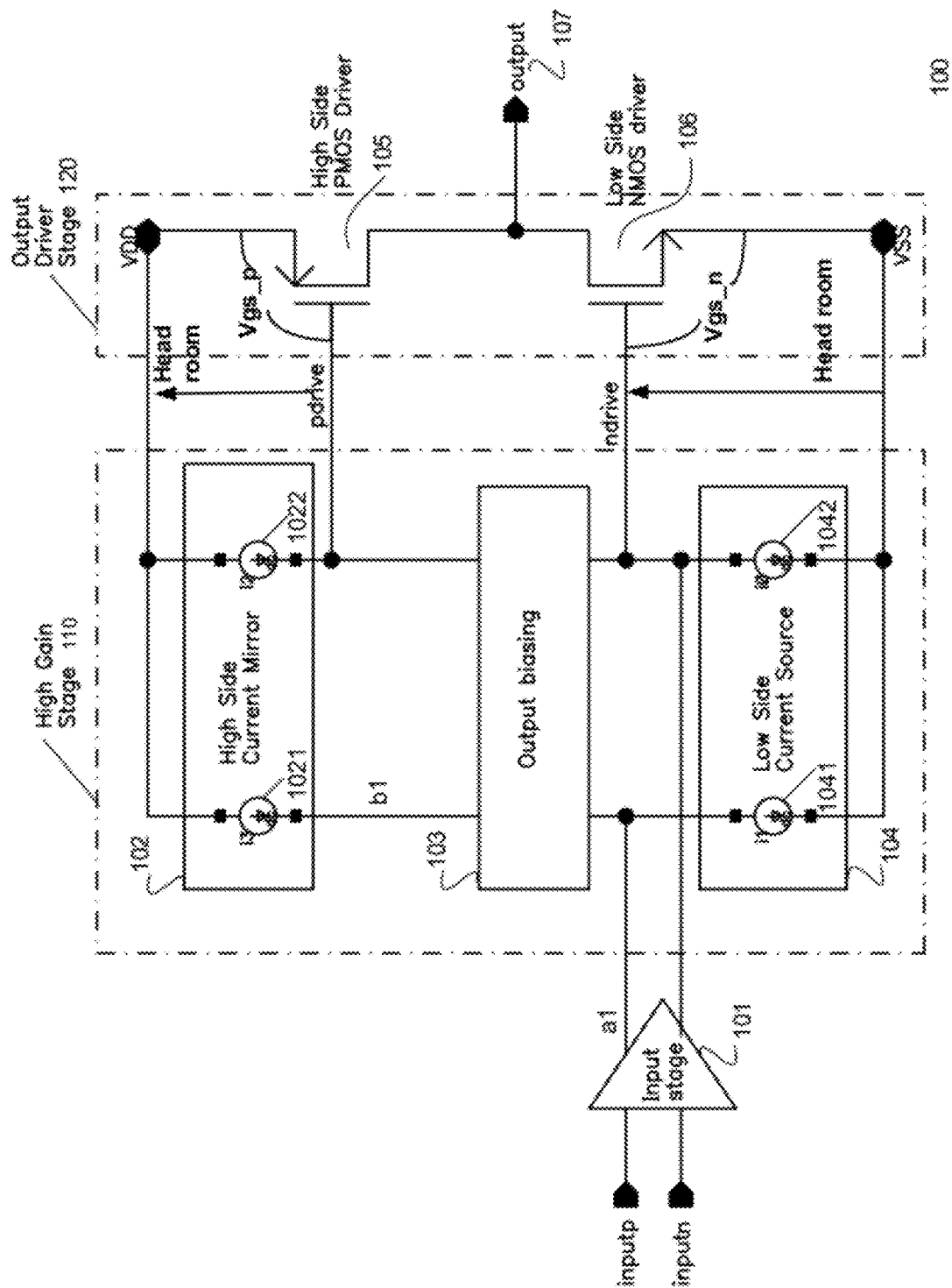
FIG. 1A shows the diagram of a prior art rail to rail output DMOS amplifier.
Figure 2A:
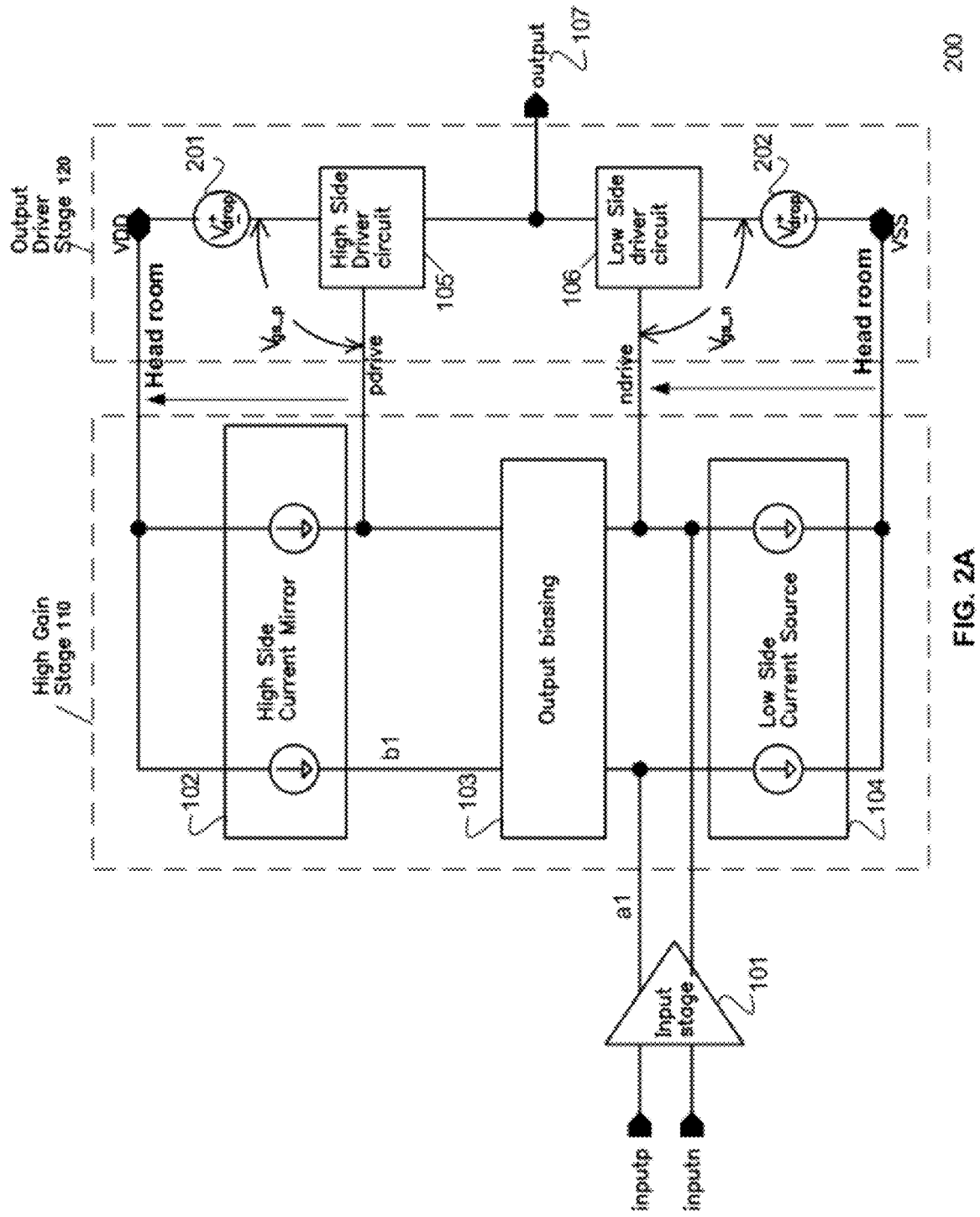
FIG. 2A shows a DMOS amplifier according to one embodiment of the present invention.

FIG. 2A shows a DMOS amplifier according to one embodiment of the present invention. To increase the headroom across current mirrors/sources, the present invention adds a voltage drop Vdrop between the source of the output driver MOS and the power rail, e.g., a Vdrop 201 at the high side of the output driver stage, and a Vdrop 202 at the low side of the output driver stage. Consequently, the headroom of current mirror is Vgs_p+Vdrop on the high side, and Vgs_n+

Vdrop on the low side. The amplifier 200 in FIG. 2A may boost the output driver gate voltage by a Vdrop away from the power rail, enhancing the headroom for the preceding gain stage. Since the current mirrors now have more headroom, they are more robust to temperature and process variations and the amplifier can be designed to have a higher gain.

Figure 2B:
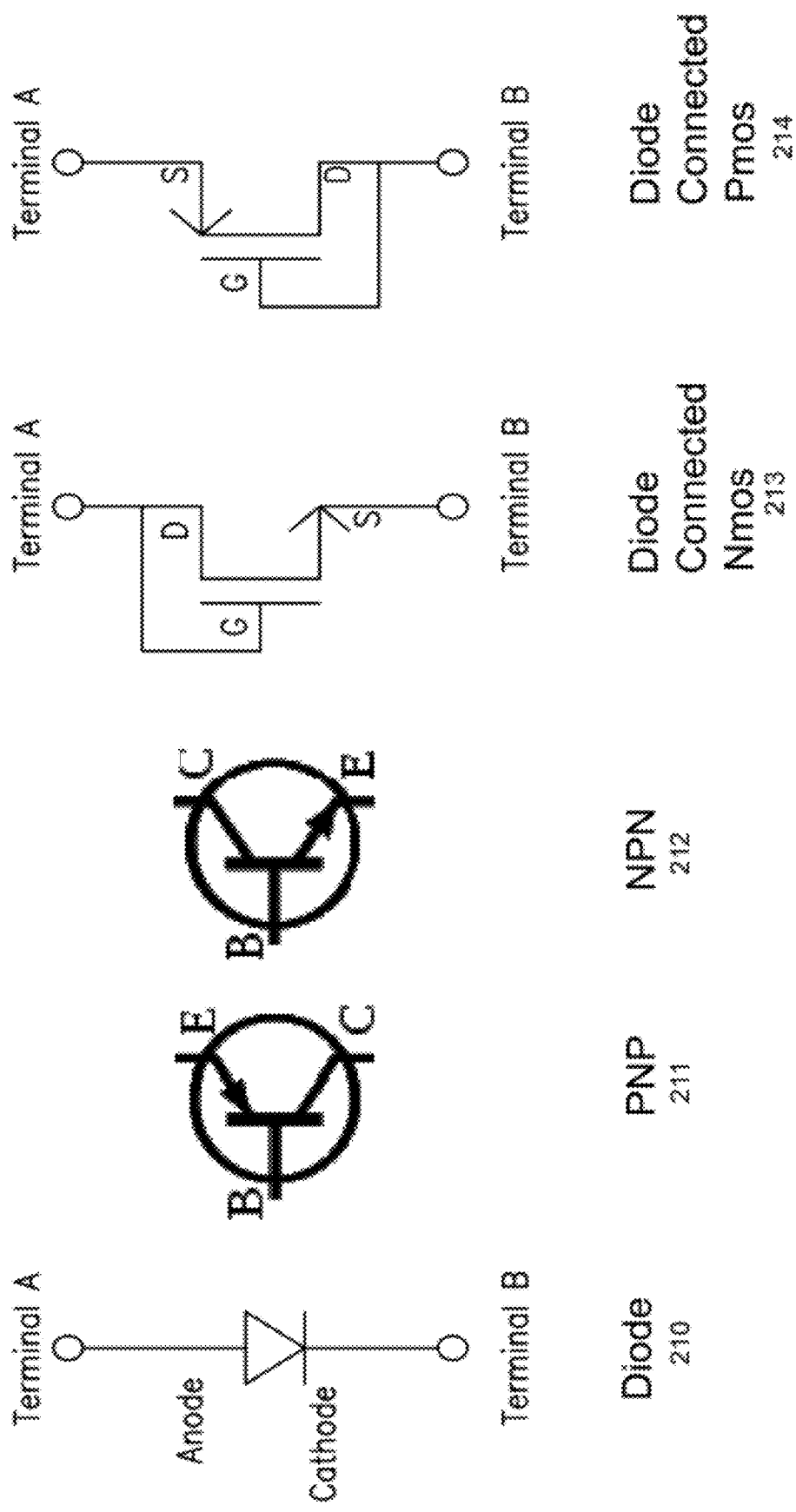
FIG. 2B shows devices that may be used to provide the Vdrop in FIG. 2A.

FIG. 2B shows devices that may be used to provide the Vdrop in FIG. 2A. As shown, the Vdrop may be provided by a diode 210, or Vbe of an npn transistor 211 or pnp transistor 212. The Vdrop may also be provided by a diode connected MOS, including NMOS 213 and PMOS 214.

Figure 2C:
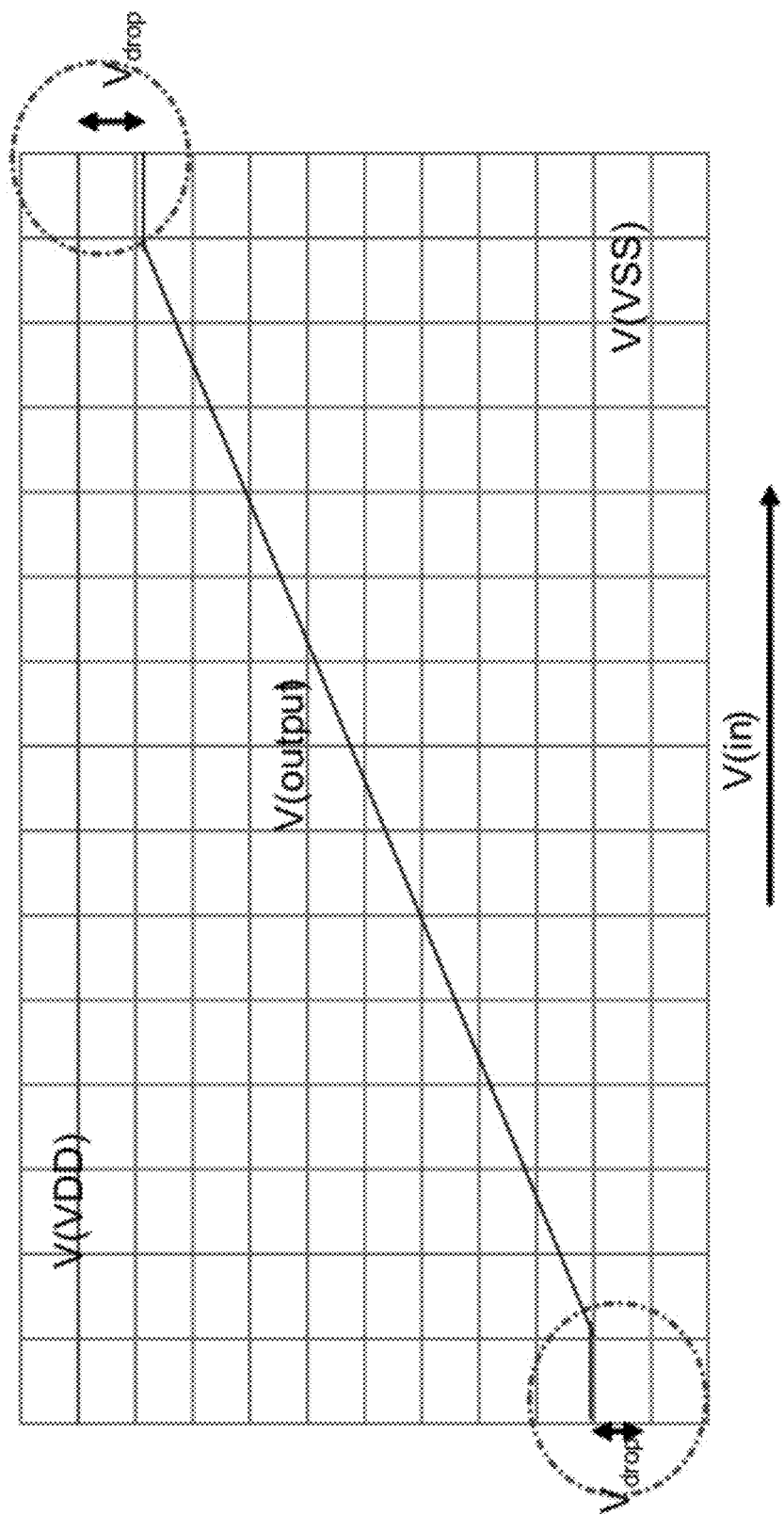
FIG. 2C shows the signal waveform of the amplifier in FIG. 2A.

FIG. 2C shows the signal waveform of the amplifier in FIG. 2A. As shown, the output cannot reach all the way to VDD or VSS as the input is swept. This is because the series Vdrop prevents the output from going to the VDD and VSS rails. Specifically, since the output of the amplifier of FIG. 2A is limited to VDD−Vdrop on the high side and VSS+Vdrop on the low side, its output swing is VDD−VSS−2×Vdrop.

Figure 3A:
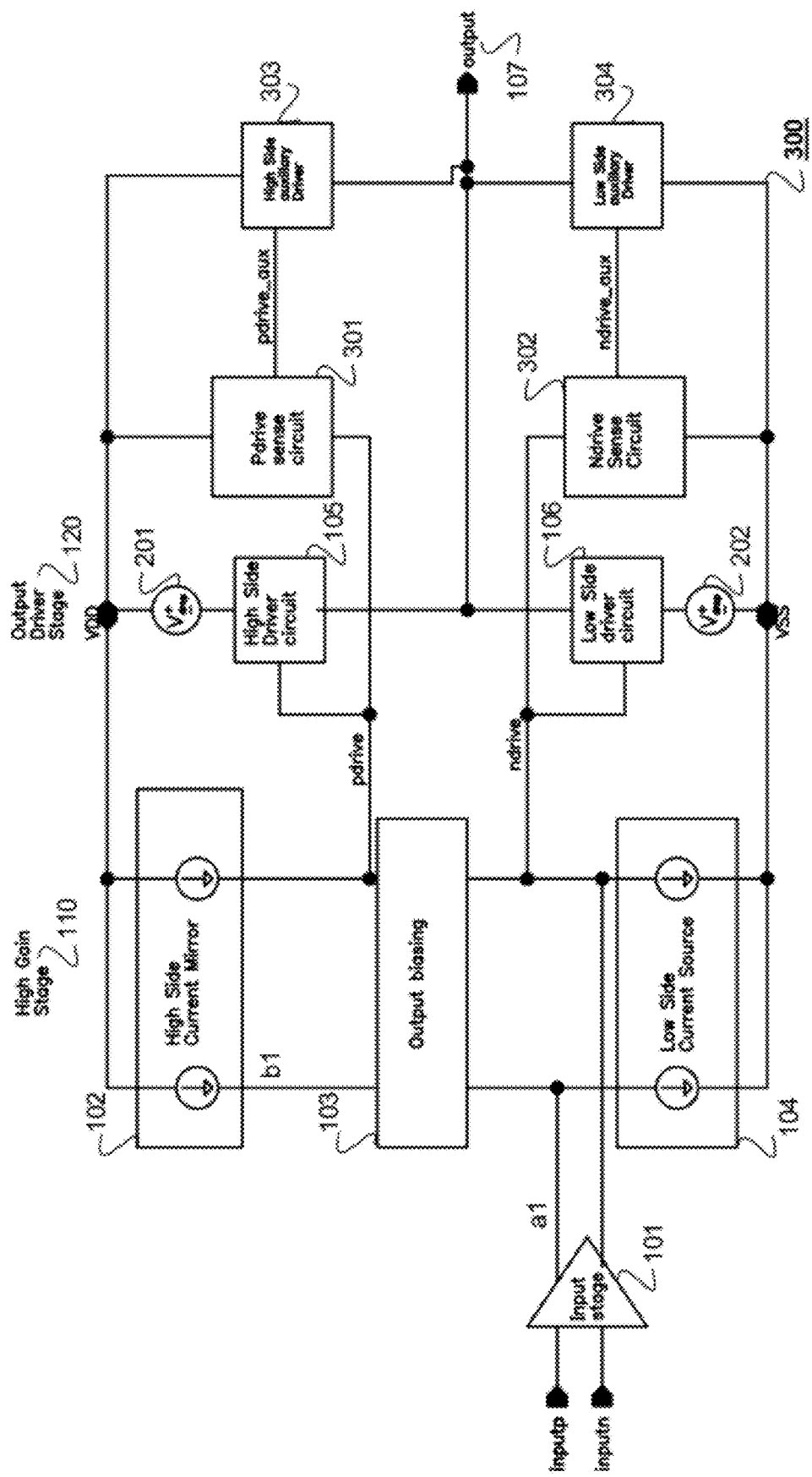
FIG. 3A shows an amplifier according to one embodiment of the present invention.

FIG. 3A shows an amplifier according to one embodiment of the present invention. The amplifier 300 in FIG. 3A uses sense circuits 301 and 302, and auxiliary drivers 303 and 304 to bypass the Vdrop and allows the conventional rail to rail operation.

Specifically, an ndrive sense circuit 302 may be coupled between the input of the low side driver circuit 106 and VSS to detect if the amplifier output is driven close to the power rail VSS and provide a signal ndrive_aux at its output to indicate the result accordingly. A low side auxiliary driver 304 may have three terminals coupled to the output of the ndrive sense circuit 302, the output 107 of the amplifier and VSS respectively, and be controlled by the signal ndrive_aux to connect or disconnect the output 107 and VSS.

When the amplifier drives the output to VSS, the ndrive signal may increase to turn on the low side driver 106 more strongly. However the path to VSS is limited by the low side Vdrop 202. The ndrive sense circuit 302 may detect a determined increase in the ndrive voltage, and may activate the low side auxiliary driver 304 which connects the output of the amplifier directly to VSS, allowing the amplifier to drive all the way to VSS. When the amplifier drives away from VSS, the ndrive voltage drops to Vgs+Vdrop and the ndrive sense circuit 302 may detect this and dis-engage the low side auxiliary driver 304. The above sequence of operation is contained within the amplifier high gain signal path. It therefore takes advantage of the amplifier high gain to provide a smooth (linear) engagement of the low side auxiliary driver 304, resulting in highly linear and continuous operation all the way to VSS. Because of the increase of the ndrive signal, the headroom across the low side current sources should increase, and the current sources should be biased robustly for high gain.

Similarly, a pdrive sense circuit 301 may be coupled between the input of the high side driver circuit 105 and VDD to detect if the amplifier output is driven close to the power rail VDD, and provide a signal pdrive_aux at its output to indicate the result accordingly. A high side auxiliary driver 303 may have three terminals coupled to the output of the pdrive sense circuit 301, the output 107 of the amplifier and VDD respectively, and be controlled by the signal pdrive_aux to connect or disconnect the output 107 and VDD.

When the amplifier drives close to the power rail VDD, the Vdrop 201 in series with the high side driver circuit 105 will prevent the output from going to the power rail VDD. Pdrive decreases away from VDD. The pdrive sense circuit 301 detects a determined decrease in pdrive from VDD, and activates the high side auxiliary driver 303, which connects the output of the amplifier directly to VDD, allowing the amplifier to drive all the way to VDD. When the amplifier drives away from VDD, pdrive drops to Vgs+Vdrop, which is below VDD. The pdrive sense circuit 301 detects this and dis-engages the high side auxiliary driver 303. The above sequence of operation is contained within the amplifier high gain signal path. It therefore takes advantage of the amplifier high gain to provide a smooth (linear) engagement of the high side auxiliary driver circuit 303, resulting in highly linear and continuous operation all the way to VDD. Because of the increase of pdrive, the headroom across the high side mirrors is even higher, and the mirrors are robustly biased for high gain.

The combination of the high and low side auxiliary drivers provides rail-to-rail operation.

The amplifier of FIG. 3A may be used in higher voltage amplifiers, e.g., 5V, where the voltage Vdrop+Vgs will not be prevented by supply restrictions. The amplifier of FIG. 3A allows the robust design of very high gain amplifiers (e.g. >100 dB) with just one gain stage by allowing increased impedance in the mirrors that holds over all operating and manufacturing conditions.

Figure 3B:
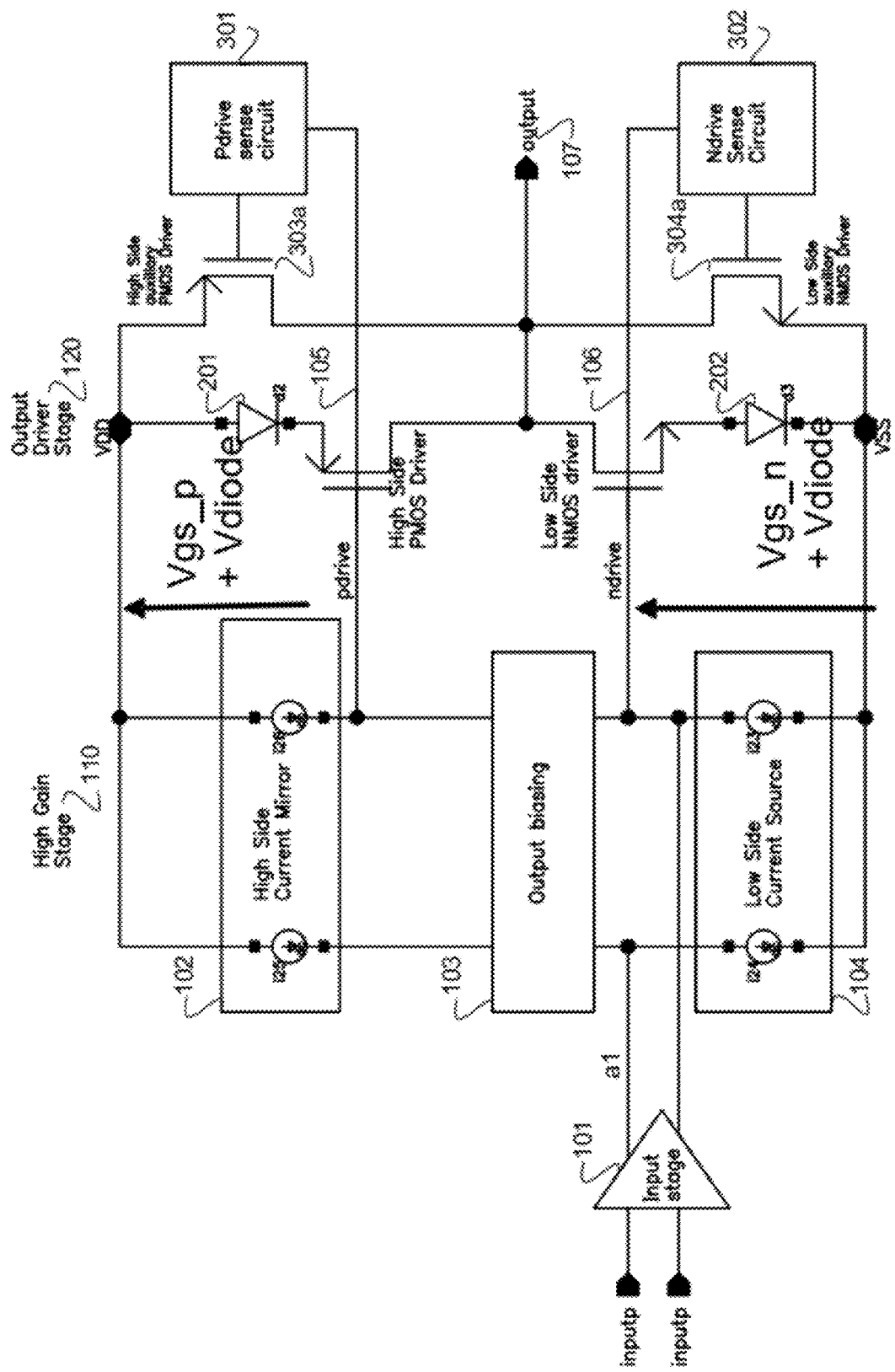
FIG. 3B shows an amplifier according to one embodiment of the present invention.

FIG. 3B shows an amplifier according to one embodiment of the present invention. As shown, the high side auxiliary driver is implemented by a PMOS driver 303a, and the low side auxiliary driver is implemented by a NMOS driver 304a.

Figure 3D:
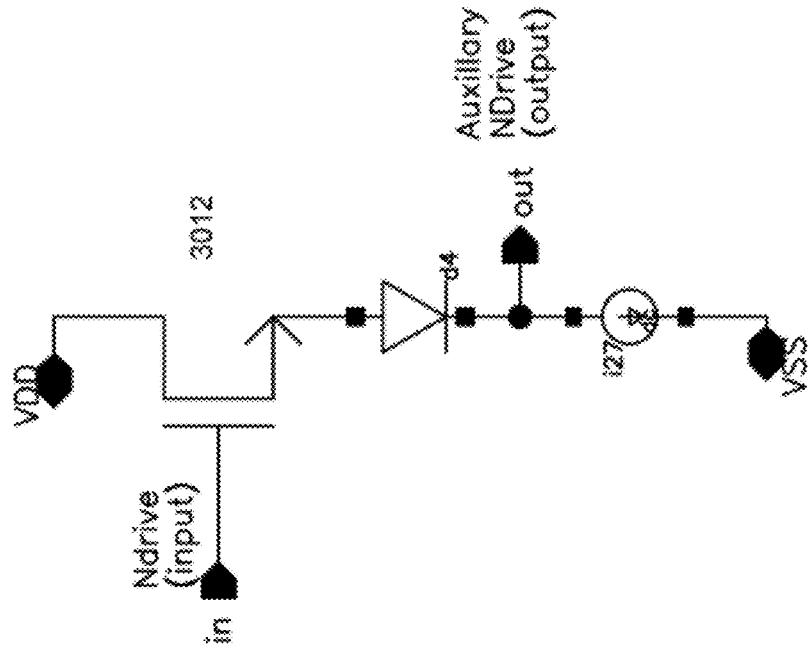
FIG. 3D shows a ndrive sense circuit 302 in the amplifier in FIG. 3A according to one embodiment of the present invention.
Figure 3C:
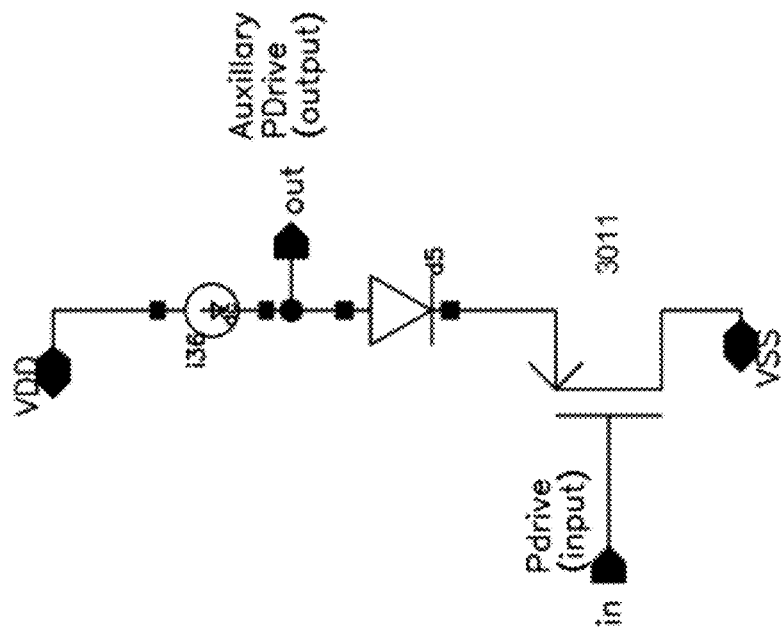
FIG. 3C shows a pdrive sense circuit 301 in the amplifier in FIG. 3A according to one embodiment of the present invention.

FIG. 3C shows a pdrive sense circuit 301 in the amplifier 300 according to one embodiment of the present invention, and FIG. 3D shows an ndrive sense circuit 302 in the amplifier 300 according to one embodiment of the present invention. The sense circuit may be implemented by a MOSFET source follower with a combination of diode drops. In FIG. 3C, the source follower 3011 may drop its gate drive voltage a Vgs of the transistor 3011 and may be provided with a further Vgs to turn on the high side auxiliary driver 303. Biasing these Vgs to be larger than the Vgs of the driver circuit 105 and the Vdrop means that the pdrive sense circuit 301 is dormant until the amplifier drives close to the power rail VDD and the gate voltage pdrive of the high side driver circuit 105 increases and turns on the high side auxiliary driver 303 in a controlled fashion. Similarly, the ndrive sense circuit 302 may be dormant until the amplifier drives close to the power rail VSS and the gate voltage ndrive of the low side driver circuit 106 increases and turns on the low side auxiliary driver 304 in a controlled fashion.

Figure 3E:
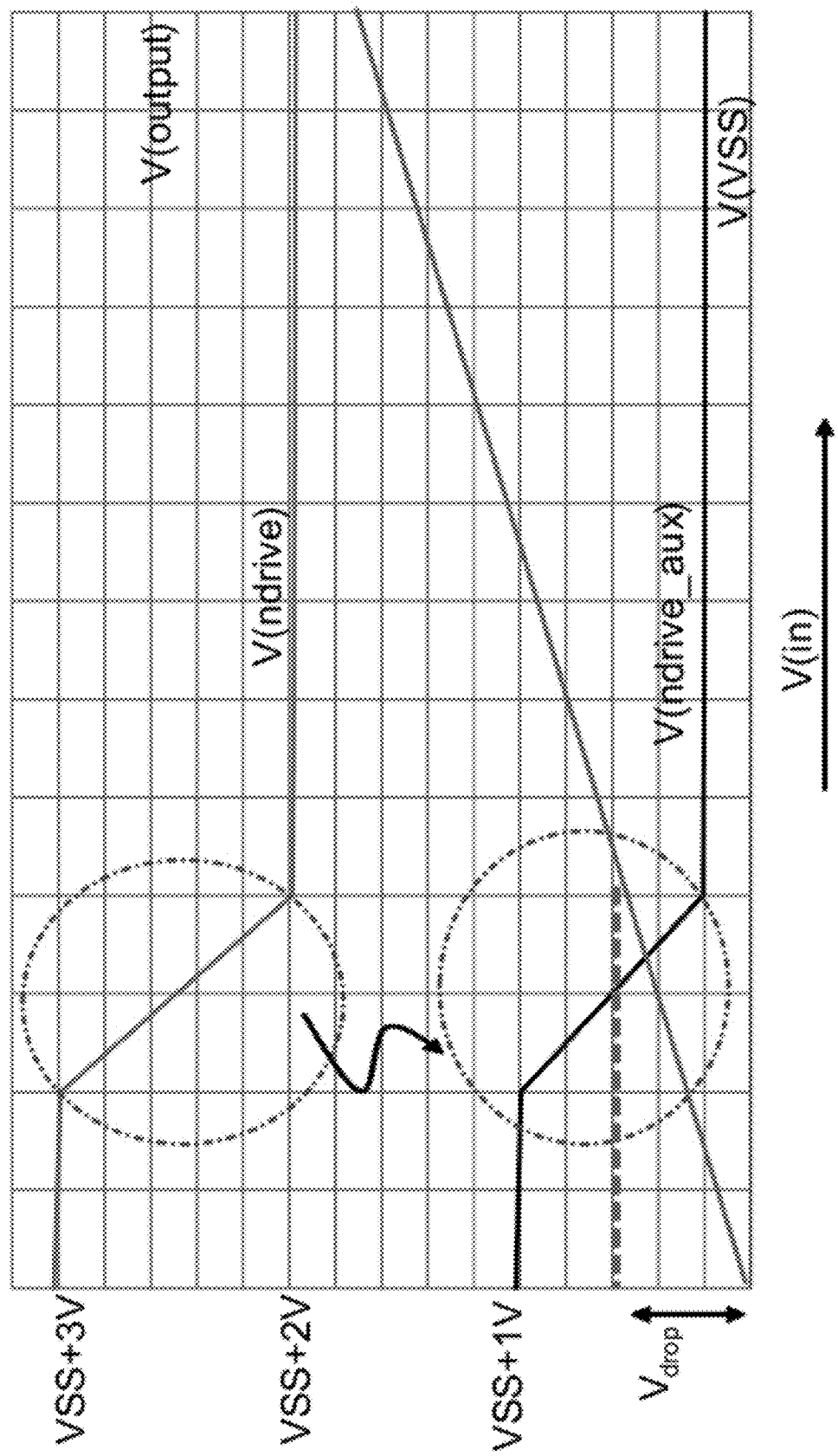
FIG. 3E shows the waveform of signals of the low side of the amplifier in FIG. 3A.

FIG. 3E shows the waveform of signals of the low side of the amplifier 300. As shown, as the input drops, the output is driven to VSS. When the output is within Vdrop of VSS, the voltage ndrive increases due to the closed loop gain of the amplifier. The increase in ndrive voltage is detected by the ndrive sense circuit 302. This in turn generates the ndrive_aux voltage to drive the low side auxiliary driver 304, which then allows the output to go all the way to VSS.

Figure 3F:
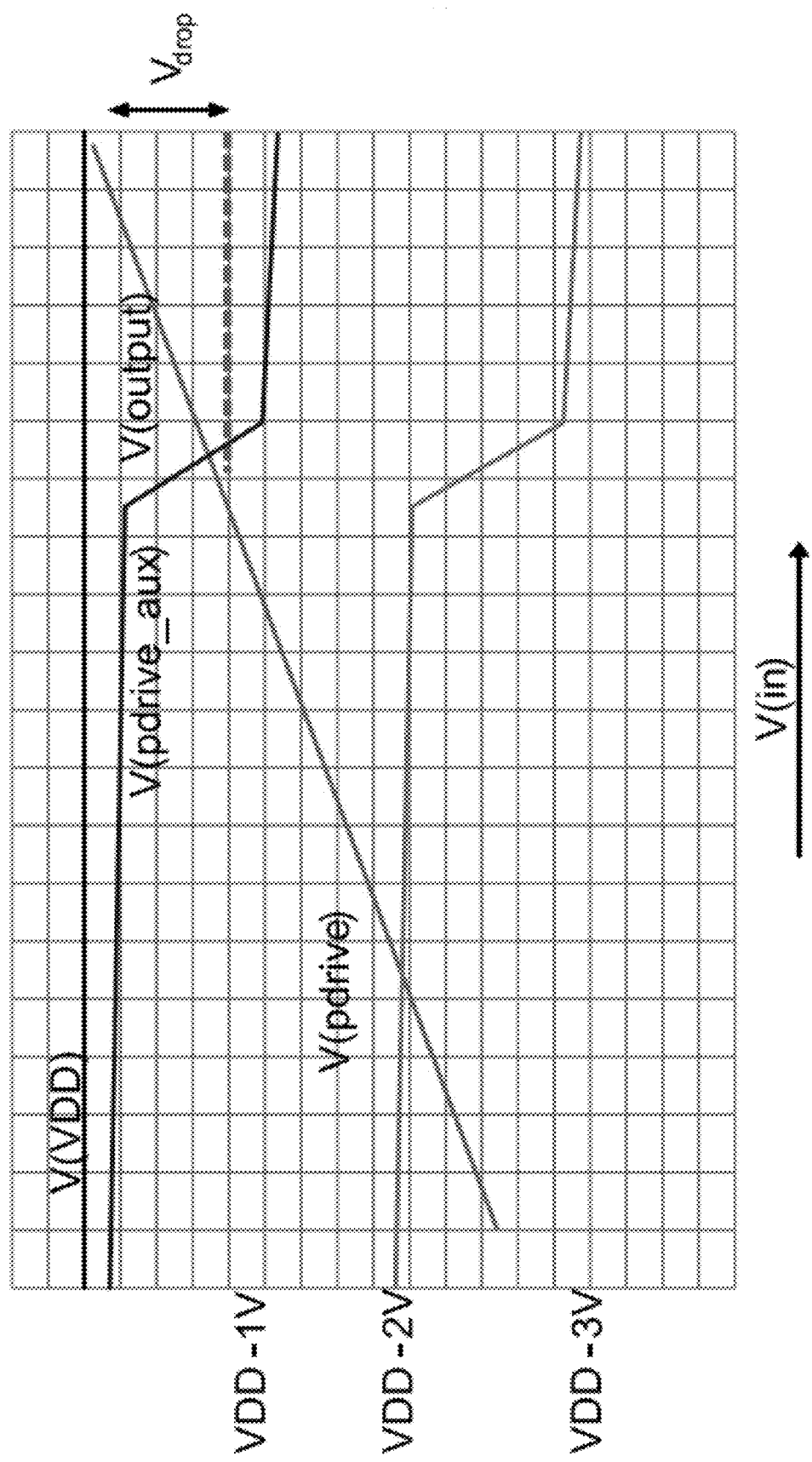
FIG. 3F shows the waveform of signals of the high side of the amplifier in FIG. 3A.

FIG. 3F shown the waveform of signals of the high side of the amplifier 300. As shown, as input increases, the output is driven to VDD. Pdrive decreases away from VDD. The decrease in pdrive voltage is detected by the pdrive sense circuit 301. This in turn generates the pdrive_aux voltage to drive the high side auxiliary driver 303, which then allows the output to go all the way to VDD.

Figure 4:
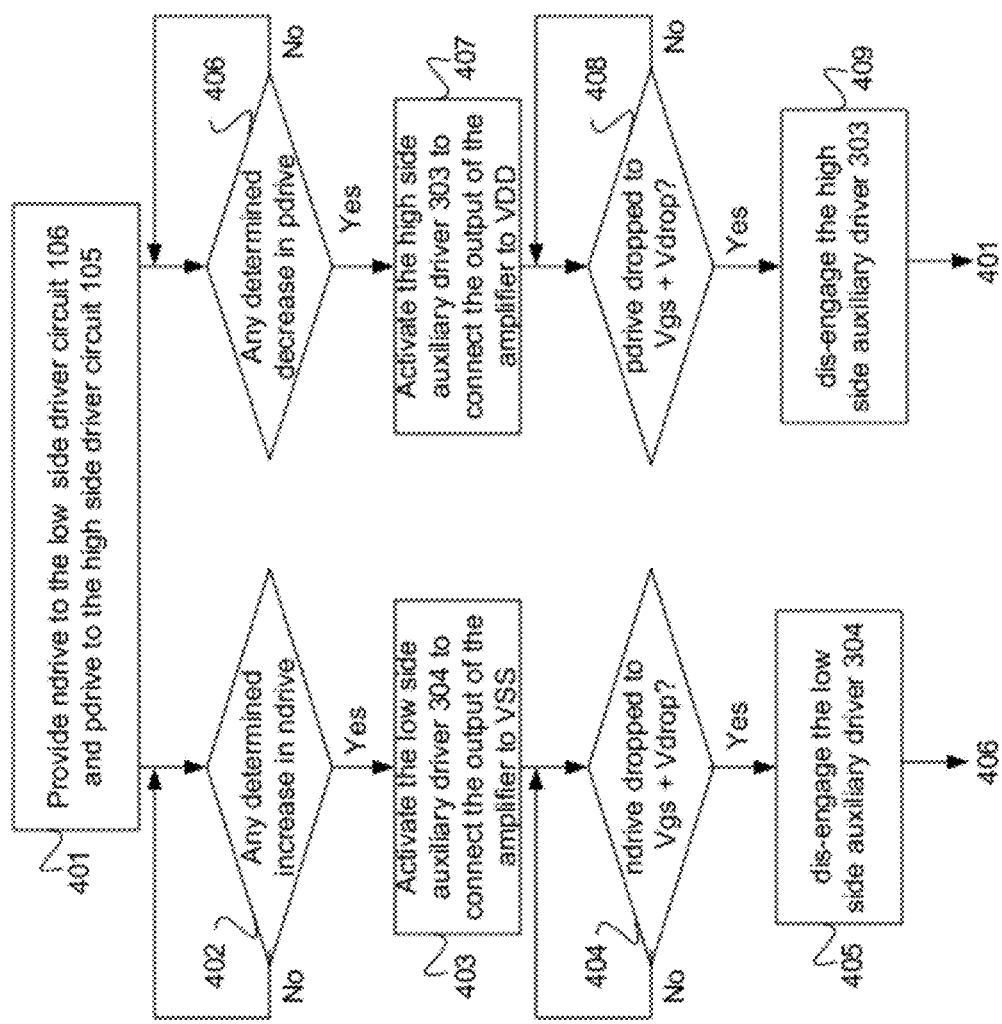
FIG. 4 shows a method for biasing the output stage of an amplifier according to one embodiment of the present invention.

FIG. 4 shows a method for biasing the output stage of an amplifier according to one embodiment of the present invention. The method may be used with the amplifier 300 shown in FIG. 3A, which employs a voltage drop 201 at the high side of the output driver stage, and a voltage drop 202 at the low side of the output driver stage.

At 401, in response to input signals inputp and inputn, the high gain stage 110 may provide the driving signal ndrive to the low side driver circuit 106 in the output driver stage 120, and the driving signal pdrive to the high side driver circuit 105 in the output driver stage 120.

At 402, the ndrive sense circuit 302 may detect if there is a determined increase in the ndrive voltage.

If yes, at 403, the ndrive sense circuit 302 may activate the low side auxiliary driver 304 which connects the output 107 of the amplifier 300 directly to VSS, allowing the amplifier to drive all the way to VSS. Otherwise, 402 may be repeated to continue to detect if there is a determined increase in the ndrive voltage.

At 404, the ndrive sense circuit 302 may detect if the ndrive voltage has dropped to Vgs+Vdrop.

If yes, at 405, the ndrive sense circuit 302 may dis-engage the low side auxiliary driver 304 to disconnect the output 107 of the amplifier from VSS. Otherwise, 404 may be repeated to continue to detect if the ndrive voltage has dropped to Vgs+Vdrop.

At 406, the pdrive sense circuit 301 may detect if there is a determined decrease in pdrive from VDD.

If yes, at 407, the pdrive sense circuit 301 may activate the high side auxiliary driver 303, which connects the output 107 of the amplifier 300 directly to VDD, allowing the amplifier to drive all the way to VDD. Otherwise, 406 may be repeated to continue to detect if there is a determined decrease in pdrive from VDD.

At 408, the pdrive sense circuit 301 may detect if pdrive has dropped to Vgs+Vdrop.

If yes, at 409, the pdrive sense circuit 301 may dis-engage the high side auxiliary driver 303 to disconnect the output 107 of the amplifier 300 from VDD. Otherwise, 408 may be repeated to continue to detect if pdrive has dropped to Vgs+Vdrop.

The process may then return to 401.

It should be understood that the flow chart shown in FIG. 4 is used to explain the general flow of the invention, instead of limiting the number and/or sequence of the steps. For example, 406 to 409 may occur before 402 to 405, or at the same time with 402 to 405.

Further embodiments are also possible, which are the result of subsets of elements of, or variously combining elements of, embodiments described.

What is claimed is:

1. An amplifier, comprising:
   a high gain stage having inputs for incoming signals and outputs for driving signals generated in response to the incoming signals, to an output driver stage; and
   the output driver stage coupled to the high gain stage, comprising:
   a first driver circuit having a first terminal receiving a first driving signal from the high gain stage, a second terminal coupled to a first power rail through a first voltage drop, and a third terminal coupled to the output terminal of the amplifier,
   a first sense circuit coupled to the first power rail, receiving the first driving signal, and detecting if an amplifier output signal is driven to within a determined value of the first power rail, and
   a first side auxiliary driver coupled to an output of the first sense circuit and being activated to connect the output terminal of the amplifier to the first power rail.

2. The amplifier of claim 1, wherein the first driver circuit is a transistor.

3. The amplifier of claim 2, wherein the first power rail is VDD, and the first driver circuit is a p-channel MOSFET (metal-oxide-semiconductor field-effect transistor) ("PMOS").

4. The amplifier of claim 2, wherein the first power rail is VDD, and the first driver circuit is a p-channel DMOSFET (double-diffused metal-oxide-semiconductor) ("DMOS").

5. The amplifier of claim 1, wherein the first voltage drop is provided by a device selected from the group consisting of a diode, an npn transistor, a pnp transistor, a diode connected n-channel MOSFET (metal-oxide-semiconductor field-effect transistor) ("NMOS") and a diode connected PMOS.

6. The amplifier of claim 1, further comprising:
   a second driver circuit having a first terminal receiving a second driving signal from the high gain stage, a second terminal coupled to a second power rail through a second voltage drop, and a third terminal coupled to the output terminal of the amplifier.

7. The amplifier of claim 6, wherein the second driver circuit is a transistor.

8. The amplifier of claim 7, wherein the second power rail is VSS, and the second driver circuit is an NMOS.

9. The amplifier of claim 7, wherein the second power rail is VSS, and the second driver circuit is a n-channel DMOS.

10. The amplifier of claim 6, wherein the second voltage drop is provided by a device selected from the group consisting of a diode, an npn transistor, a pnp transistor, a diode connected NMOS and a diode connected PMOS.

11. The amplifier of claim 1, wherein the first sense circuit comprises a MOSFET source follower.

12. The amplifier of claim 1, further comprising:
   a second sense circuit coupled to the second power rail, receiving the second driving signal, and detecting if an amplifier output signal is driven close to the second power rail.

13. The amplifier of claim 12, further comprising:
   a second side auxiliary driver coupled to an output of the second sense circuit and being activated to connect the output terminal of the amplifier to the second power rail.

14. The amplifier of claim 13, wherein the second sense circuit comprises a MOSFET source follower.

15. A method for biasing an amplifier, comprising:
   providing a first driving signal to a first driver circuit in response to incoming signals;
   providing a first voltage drop between a first power rail and the first driver circuit;
   detecting if an output signal of the amplifier is driven to the first power rail; and
   connecting an output terminal of the amplifier to the first power rail when an output signal of the amplifier is driven to within a determined value of the first power rail.

16. The method of claim 15, further comprising:
   providing a second driving signal to a second driver circuit in response to the incoming signals; and
   providing a second voltage drop between a second power rail and the second driver circuit.

17. The method of claim 16, further comprising:
   detecting if an output signal of the amplifier is driven close to the second power rail.

18. The method of claim 17, further comprising:
   connecting the output terminal of the amplifier to the second power rail when an output signal of the amplifier is driven close to the second power rail.

19. An amplifier, comprising:
   a high gain stage having inputs for incoming signals and outputs for driving signals generated in response to the incoming signals, to an output driver stage; and
   the output driver stage coupled to the high gain stage, comprising:

a first driver circuit having a first terminal receiving a first driving signal from the high gain stage, a second terminal coupled to a first power rail through a first voltage drop, and a third terminal coupled to the output terminal of the amplifier;

a second driver circuit having a first terminal receiving a second driving signal from the high gain stage, a second terminal coupled to a second power rail through a second voltage drop, and a third terminal coupled to the output terminal of the amplifier;

a first side auxiliary driver selectively coupled to the output terminal of the amplifier when the amplifier output signal is driven to within a determined value of the first power rail; and a second side auxiliary driver selectively coupled to the output terminal of the amplifier when the amplifier output signal is driven to within a determined value of the second power rail.

20. An amplifier, comprising:

a high gain stage having inputs for incoming signals and outputs for driving signals generated in response to the incoming signals, to an output driver stage;

the output driver stage coupled to the high gain stage, comprising:

a first driver circuit having a first terminal receiving a first driving signal from the high gain stage, a second terminal coupled to a first power rail through a first voltage drop, and a third terminal coupled to the output terminal of the amplifier; and a second driver circuit having a first terminal receiving a second driving signal from the high gain stage, a second terminal coupled to a second power rail through a second voltage drop, and a third terminal coupled to the output terminal of the amplifier;

a first sense circuit coupled to the first power rail, receiving the first driving signal, and detecting if an amplifier output signal is driven to within a determined value of the first power rail;

a first side auxiliary driver coupled to an output of the first sense circuit and being activated to connect the output terminal of the amplifier to the first power rail;

a second sense circuit coupled to the second power rail, receiving the second driving signal, and detecting if an amplifier output signal is driven to within a determined value of the second power rail; and a second side auxiliary driver coupled to an output of the second sense circuit and being activated to connect the output terminal of the amplifier to the second power rail.

* * * * *